(12) United States Patent (10) Patent No.: US 9,153,347 B2
Xu (45) Date of Patent: Oct. 6, 2015

(54) METHOD AND SYSTEM FOR RELIABLE BIG CAPACITY STORAGE SYSTEM PROTECTED BY TRIPLE PROTECTION

(71) Applicant: Feiyue Xu, Fremont, CA (US)

(72) Inventor: Feiyue Xu, Fremont, CA (US)

( * ) Notice: Subject to any disclaimer, the term of this patent is extended or adjusted under 35 U.S.C. 154(b) by 118 days.

(21) Appl. No.: 14/098,534

(22) Filed: Dec. 6, 2013

(65) Prior Publication Data

US 2015/0162102 A1 Jun. 11, 2015

(51) Int. Cl.
*G11C 29/00* (2006.01)
(52) U.S. Cl.
CPC ...................................... *G11C 29/765* (2013.01)
(58) Field of Classification Search
CPC ....................................................... G11C 29/765
See application file for complete search history.

(56) References Cited

U.S. PATENT DOCUMENTS 6,223,323 B1 * 4/2001 Wescott ........................ 714/770
2012/0084505 A1 * 4/2012 Colgrove et al. ............. 711/114

* cited by examiner

*Primary Examiner* — Sam Rizk
(74) *Attorney, Agent, or Firm* — Chen-Chi Lin

(57) ABSTRACT

The method delivers a storage system for Big Data usage. The system contains a matrix of unreliable physical data devices and data in this reliable big capacity storage system is protected by the triple protection so the method and system can protect storage system from more than 2 fault data devices. In some cases, the system can still deliver data when system has many failed data devices at the same. Floating Parity technology can also avoid heavily writing data to some device surfaces, due to parity update, which cause data device to be failed before expected device life time.

19 Claims, 22 Drawing Sheets

| D1 | Px1 | | |
|---|---|---|---|
| Py1 | | | |
| | | | |
| | | | |

FIG. 6A

| D1 | D2 | Px1 | |
|----|----|-----|--|
| Py1 | Py2 | | |
| | | | |
| | | | |

FIG. 6B

| D1 | D2 | D3 | Px1 |
|----|----|----|-----|
| Py1 | Py2 | Py3 | |
| | | | |
| | | | |

FIG. 6C

| D1 | D2 | D3 | Px1 |
|----|----|----|-----|
| D4 | Px2 | Py3 | |
| Py1 | Py2 | | |
| | | | |

FIG. 6D

| D1 | D2 | D3 | Px1 |
|----|----|----|-----|
| D4 | D5 | Px2 | |
| Py1 | Py2 | Py3 | |
| | | | |

FIG. 6E

| D1 | D2 | D3 | Px1 |
|----|----|----|-----|
| D4 | D5 | D6 | Px2 |
| Py1 | Py2 | Py3 | |
| | | | |

FIG. 6F

| D1 | D2 | D3 | Px1 |
|----|----|----|-----|
| D4 | D5 | D6 | Px2 |
| D7 | D8 | D9 | Px3 |
| Py1 | Py2 | Py3 | |

FIG. 6G

| D1 | D2 | D3 | Px1 |
|----|----|----|-----|
| D4 | D5 | D6 | Px2 |
| D7 | D8 | D9 | Px3 |
| Py1 | Py2 | Py3 | |

FIG. 7A

| D1 | D2 | D3 | Px1 |
|---|---|---|---|
| Py1 | D5 | D6 | Px2 |
| D7 | D8 | D9 | Px3 |
| D10 | Py2 | Py3 | |

FIG. 7B

| D1 | D2 | D3 | Px1 |
|----|----|----|-----|
| Py1 | D5 | D6 | Px2 |
| D7 | D8 | D9 | Px3 |
| D10 | Py2 | Py3 | |

FIG. 8A

| D1 | D2 | D3 | Px1 |
|----|----|----|-----|
| Py1 | D5 | D6 | Px2 |
| D7 | Py2 | D9 | Px3 |
| D10 | D11 | Py3 | |

FIG. 8B

METHOD AND SYSTEM FOR RELIABLE BIG CAPACITY STORAGE SYSTEM PROTECTED BY TRIPLE PROTECTION

BACKGROUND OF THE INVENTION

In current technology, the storage is protected from limited number of faulty devices. In common practice, the majority of storage products can only protect up to 2 faulty devices. In such case, if 3 devices in one row are failed at the same time, loss of data occurs. The scenario of 3 faulty data devices at the same time in the same row is treated as impossible case. However, in the reality, it happens especially after running storage system for more than 5 years when devices in the system are about running out of guaranteed life time. In such cases, multiple faulty data devices can be triggered during recovering 1 faulty device. It is because, when one device is dead, many other data devices in the same shelf are also very weak and easily to run to death. This invention delivers a method to create a reliable storage system that can prevent file system failure due to more than 2 device failures.

SUMMARY OF THE INVENTION

This invention delivers a method to protect storage system when storage system may have more than 2 failed data devices at the same time. The method is to use triple protection to protect storage system. This triple protection is implemented by a method so the storage system is protected in 2 directions and 2 layers. The protection in 2 directions can recover storage system when N devices are failed at the same time as long as no more than 2 faulty devices in both directions at the same time. If the protection in 2 directions is not able to protect storage system in very rare case, protection in second layer can still recover storage system. So the method in this invention provides a greatest protection to file system.

This invention also delivers a method to reduce device failure by Floating Parity technology which distributes data write operations to different area to avoid some data device surfaces to be used much more often than others. This Floating Parity method can prevent a particular data device having a greater chance of device failure than other devices in the system. This is an efficient way to help devices to run longer time.

In general, the storage system described in this invention consists of several Big Data Devices and each Big Data Device contains a matrix of data devices protected by row and column parity in Floating Parity technology. This invention describes a method to provide not only a huge capacity of storage system but also very reliable storage system.

BRIEF DESCRIPTION OF DRAWINGS

FIG. 6A to 6G shows an embodiment of Floating Parity FIGS. 7A & 7B shows an embodiment of Floating Parity FIGS. 8A & 8B shows an embodiment of Floating Parity

DETAILED DESCRIPTION

This invention will now be described in detail with various embodiments, examples by references to related figures. While the disclosure of the invention will be described in conjunction with the exemplary embodiments provided below, the invention are not intended to limit the embodiments. On the contrary, the disclosure is intended to cover all parts of the invention as defined by the appended claims. Furthermore, in the following detailed description, numerous details are set forth in order to provide a thorough understanding of the invention. In other instances, well-known methods and procedures have not been described in detail as they are not aspects of this invention.

This invention provides a method to create a Reliable Big Capacity Storage System, comprised of many Big Data Devices built with many unreliable physical devices in small capacity. When accessing data on Big Data Device, there is no difference from accessing physical device in small capacity. So, this Big Data Device is still a device for data, similar with physical device, but a much reliable data device and gives huge data space. When a physical device in small capacity inside of a Big Data Device is fault, the Big Data Device will still be available in delivering requested data. Also, when the fault physical device is replaced with good device in hot spare pool, this Big Data Device automatically recovers data on this physical device. This invention also provides a method so Big Data Device can still provide requested data when more than 2 physical devices in one row inside Big Data Device are fault at the same time, and data on physical devices can be recovered after replacing bad physical devices with good ones. This invention also provides a method so data writing to Big Data Device are properly distributed to different blocks in different physical device.

Figure 2:
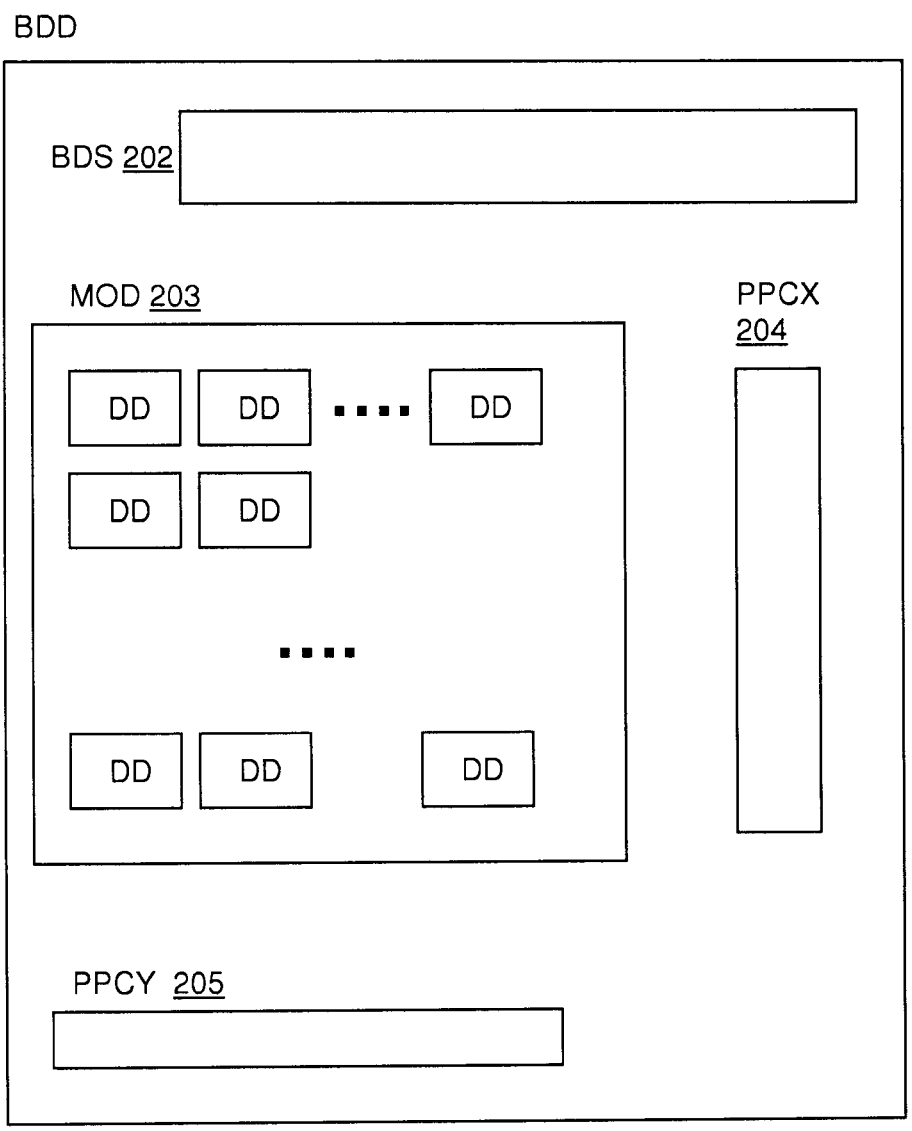
FIG. 2 is a diagram showing an embodiment of Big Data Device

Big Data Device described in this invention is constructed by many physical devices in small capacity. All these physical devices are logically organized into a matrix, N physical devices in a row by M rows. This is showed in FIG. 2. A matrix of devices (MOD 203 in FIG. 2) is comprised of many data devices (DD in FIG. 2). The big data space (BDS 202 in FIG. 2) presents a big data capacity of this Big Data Device (BDD 201 in FIG. 2). The persistent parity cache for parity X (PPCX 204 in FIG. 2) is a temporary space in memory to cache active parity in row in the matrix, while the persistent parity cache for parity Y (PPCY 205 in FIG. 2) is a temporary space in memory to cache active parity in column in the matrix. The row parity and column parity provide data protection in 2 directions.

Figure 1A:
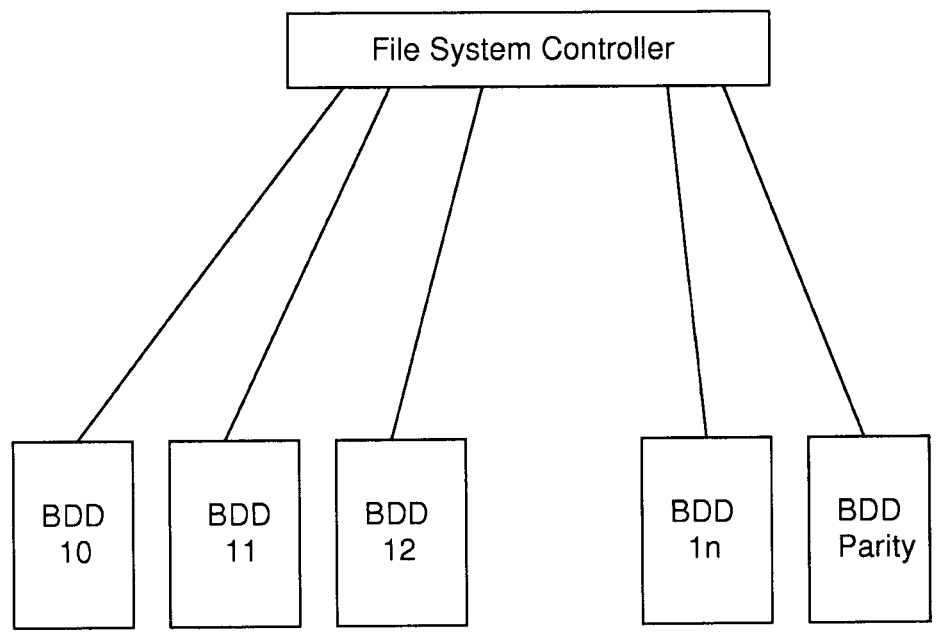
FIGS. 1A & 1B is a diagram showing an embodiment of Reliable Big Capacity Storage System
Figure 1B:
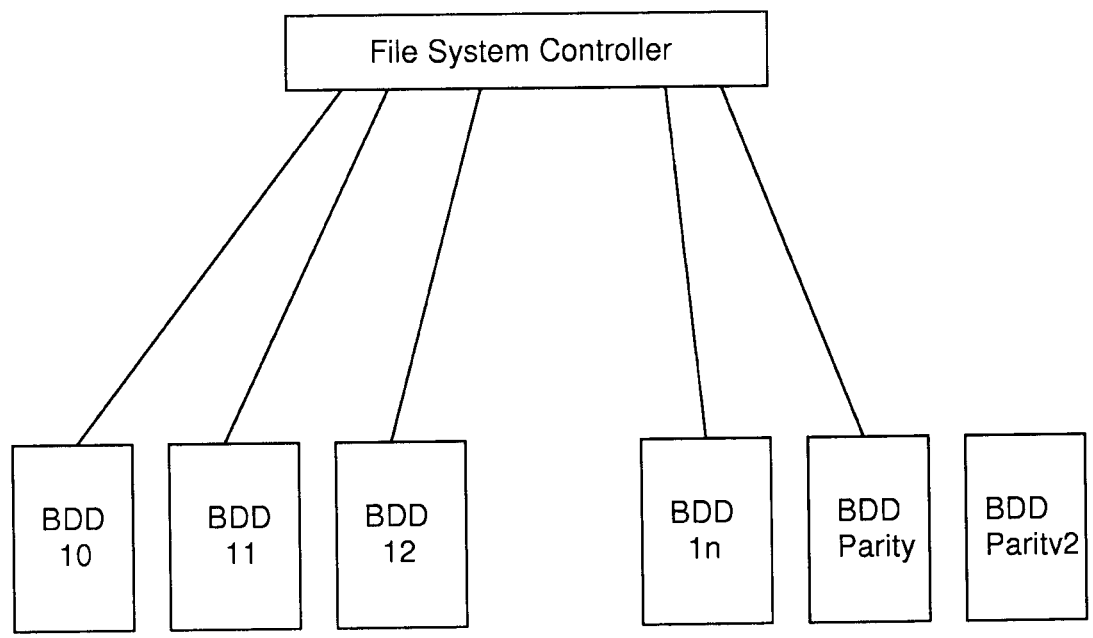

Bid Data Devices (BDD in FIGS. 1A & 1B) in storage system (FIGS. 1A & 1B) are grouped together and presented to application server or file server as a file system. However each of Big Data Device has very large data space too, much bigger than a single physical device. All Big Data Deices are protected by well known protection method, like row parity system, or called as Redundant Array of Inexpensive Disks. This gives a protection at different system layer so storage system is protected by 2 layer protection. The first layer protection is the protection inside Big Data Device, called as 2 direction protection, and second layer protection is in storage system layer, among all Big Data Devices, by Redundant Array of Inexpensive Disks. The second layer protection is presented in FIG. 1A, with 1 parity, or FIG. 1B, with 2 parities.

Figure 3A:
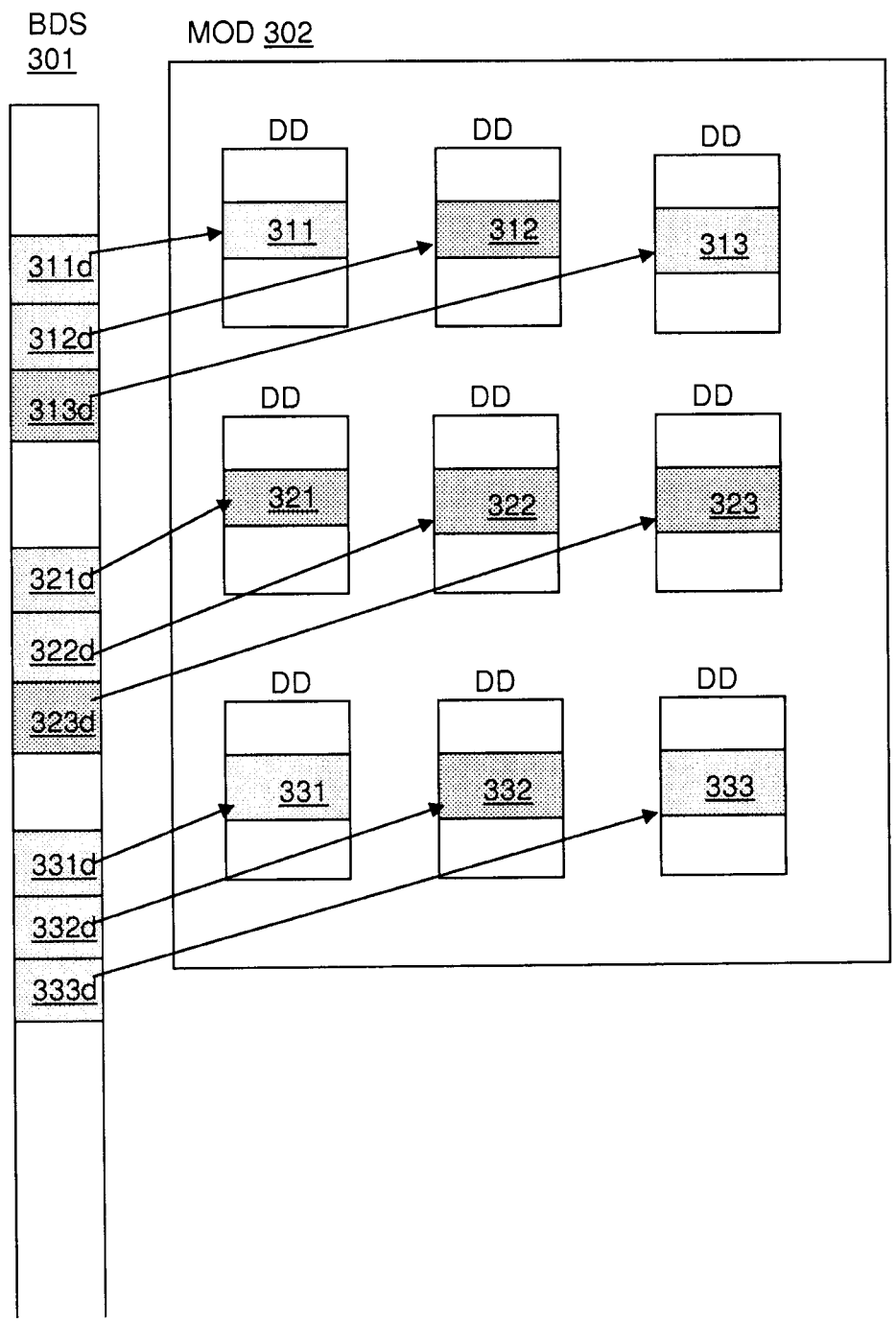
FIG. 3A to 3B shows the Matrix of Device in Big Data Device
Figure 3B:
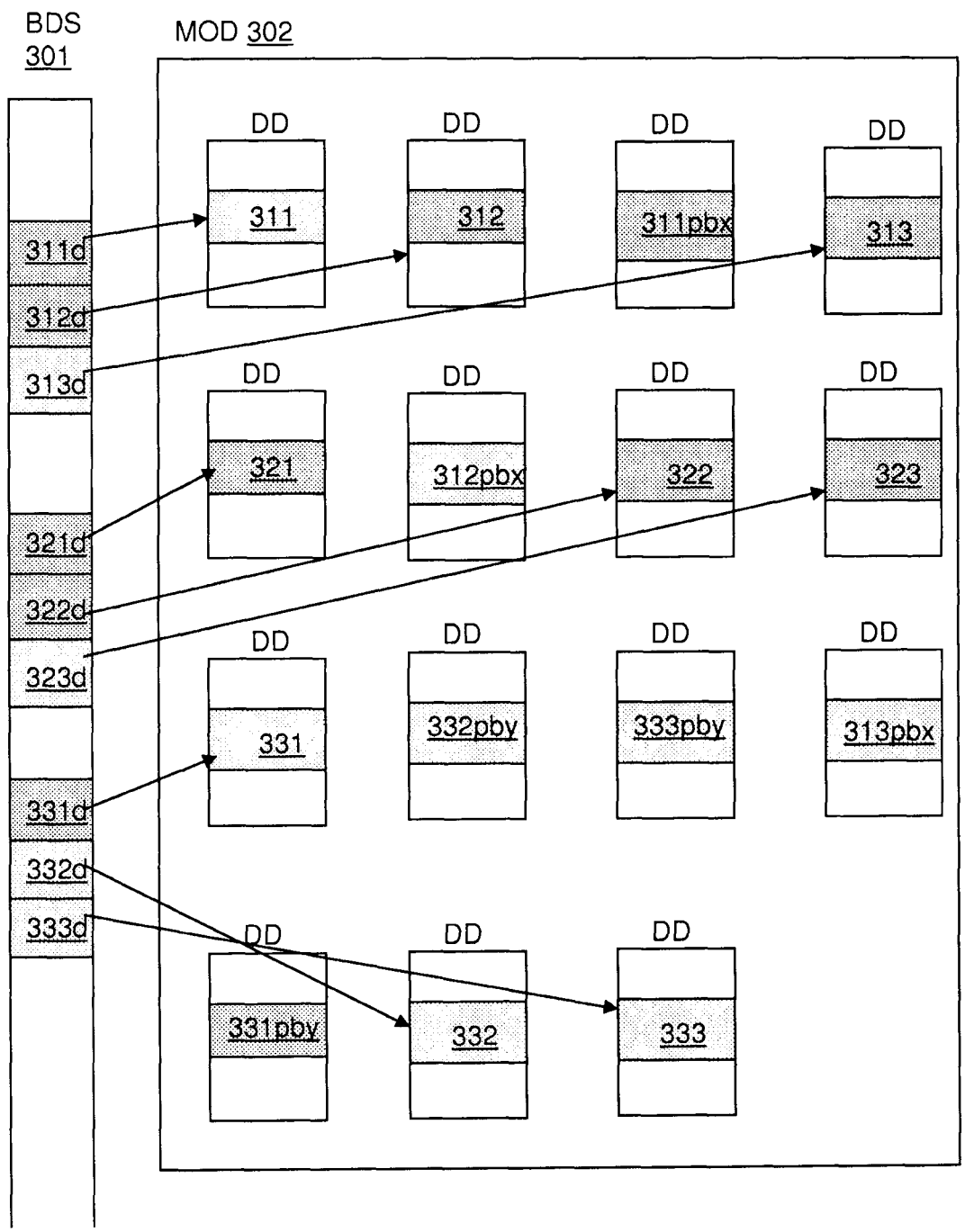

FIGS. 3A and 3B give a close look at matrix of devices (MOD 302 in FIG. 3). Big data space (BDS 301 in FIG. 3A) is a virtual presentation of data space backed up by MOD.

Each data block in BDS is referred to a particular data block in a data device (DD in FIG. 3A) inside of matrix of device (MOD 302 in FIG. 3A). As showed in FIG. 3A, data block 311*d* in FIG. 3A is referred to data block in DD 311 in FIG. 3A. And data block 312*d* at next logical block address (LBA) in BDS is referred to data block 312 on next data device in the same row, and so on.

Data block in data device (DD in FIG. 3A) is protected by parity blocks, row parity and column parity. This is described in FIG. 3B. FIG. 3B shows parity blocks in both row and column. However, parity block (pbx in FIG. 3B) in a row is not necessary to be most right data device (DD in FIG. 3B) at that row, and parity block (pby in FIG. 3B) in a column is not necessary to be the bottom data device (DD in FIG. 3B) at that column. The pbx can be in any data device in that row, and pby can be in any data device in that column. As described in FIG. 3B, pbx in row 2 (312*pbx* in FIG. 3B) can be in second data device in second row, while pby in column 2 (332*pby* in FIG. 3B) can be in third data device in second column. All row parity blocks on the same row of data devices are not necessary to be on the same data device. These row parity blocks in the same row can be spread on any data device in that row, and, of course, all can also be on one particular data device on that row. So do all column parity blocks. Writing all parity blocks in one row into one particular data device is one special case. So do all column parity blocks. This, writing parity block to different data device, is called Floating Parity method. Floating Parity is to avoid writing parity block into a particular data device because parity block is updated very often than data device.

Figure 4:
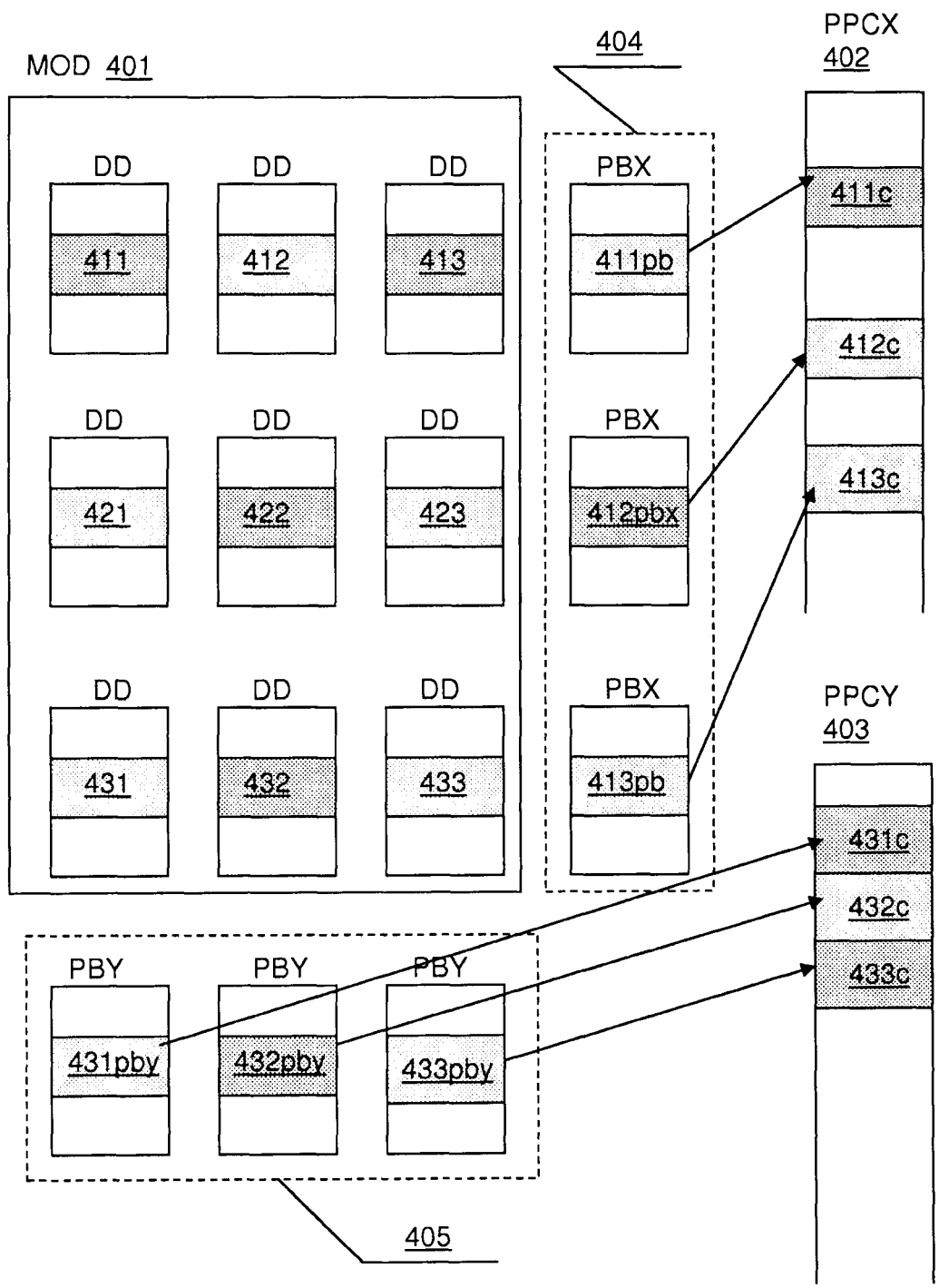
FIG. 4 presents a logical diagram of Big Data Device

In FIG. 4, diagram is redrawn to present matrix of device (MOD 401 in FIG. 4) logically, so all parity blocks (411*pbx*, 412*pbx*, 413*pbx*, 431*pby*, 432*pby*, and 433*pby* in FIG. 4) are moved out of MOD, and are grouped together to be one logical parity device (PBX or PBY in FIG. 4). However, in Big Data Device system, there may, or may not, be a specific parity device in MOD to keep all parity blocks in that row of data devices or in column. Put parity blocks outside of MOD purely for showing the relationship between parity block (pbx and pby in FIG. 4) and persistent parity cache (PPCX 402 and PPCY 403 in FIG. 4). As it is showed in FIG. 4, most recent parity blocks, called active parity blocks, are resided in cache in persistent memory for performance enhancement. The active parity blocks in FIG. 4, 411*c* is a copy of 411*pbx*,
412*c* is a copy of 412*pbx*,
413*c* is a copy of 413*pbx*,
431*c* is a copy of 431*pby*,
432*c* is a copy of 432*pby*,
and 433*c* is a copy of 433*pby*, are kept in persistent parity cache. The active parity blocks in persistent parity cache are written to parity block (PBX and PBY in FIG. 4) when system needs to write multiple data blocks in that row or column, or after a period of time when active parity block is old enough. That is, when few data block is written with new data to data devices in a row, new parity block is written to persistent parity cache (PPCX or PPCY in FIG. 4). When more data blocks in that row are written with new data or after a period of time, write parity blocks into device. In such way, the number of writing operation for parity block can be reduced. This is very important and efficient way to keep data device live longer when data device is a solid-state drive as an example.

This invention describes a method in organizing data devices in matrix and also defines a method in arranging parity block. The parity block is generated in well known approach. However, in this invention, parity block is not saved on a fixed physical data device. This is called as Floating Parity. The Floating Parity algorithm selects the location of parity block randomly, or in sequence in a list of all available device blocks. Along with persistent parity cache, Floating Parity can reduce large number of write operation to a particular data device to increase the life time of data device.

Figure 5A:
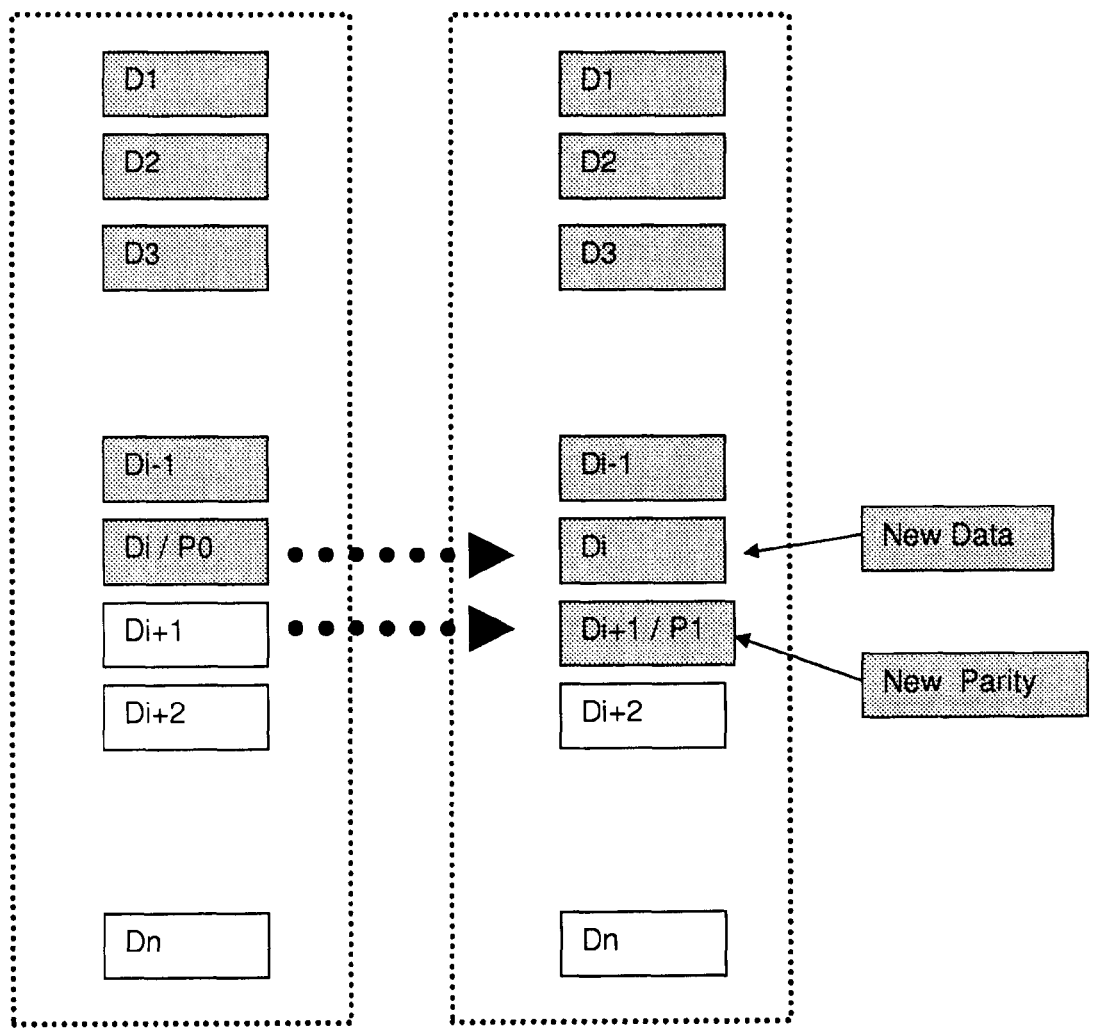
FIG. 5A to 5C shows an embodiment of Floating Parity
Figure 5B:
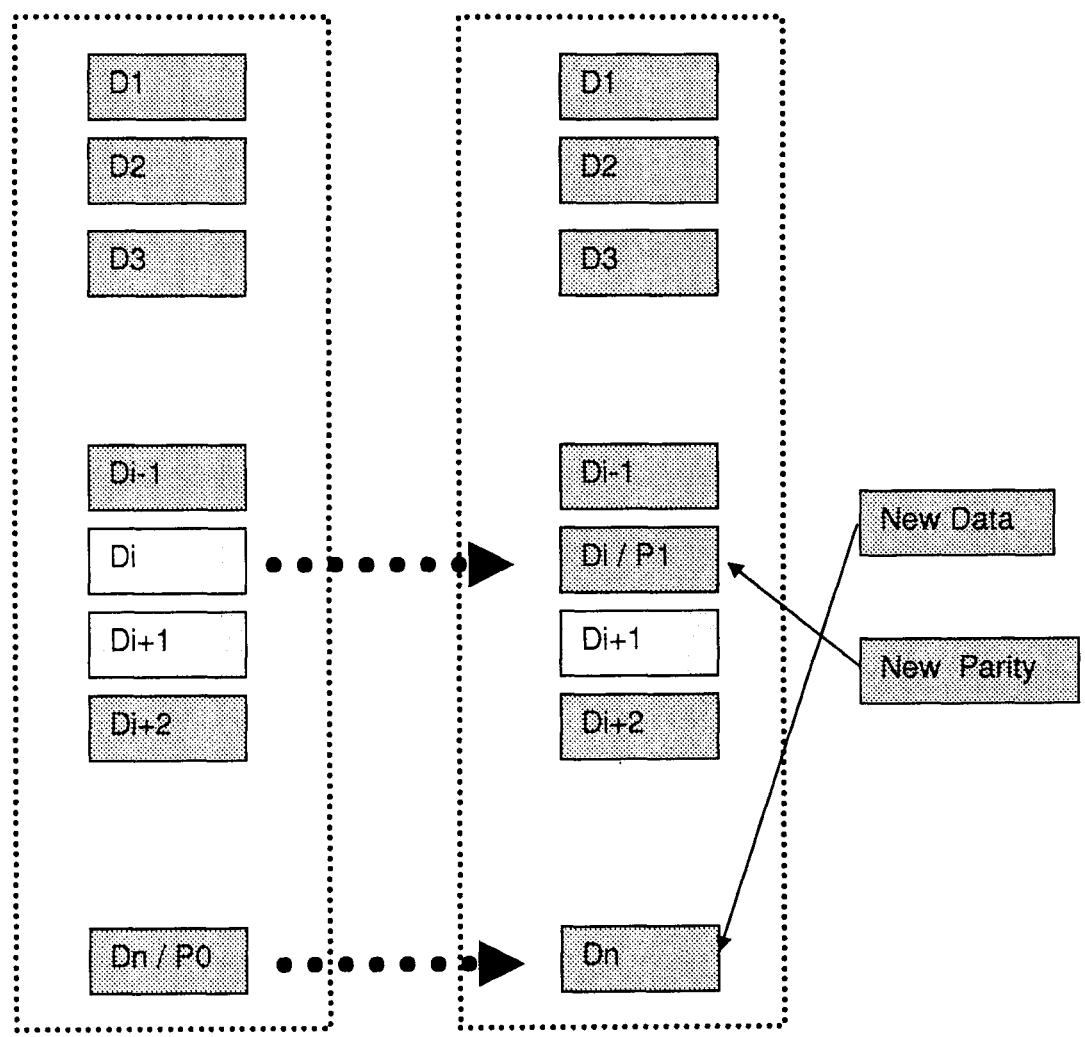
Figure 5C:
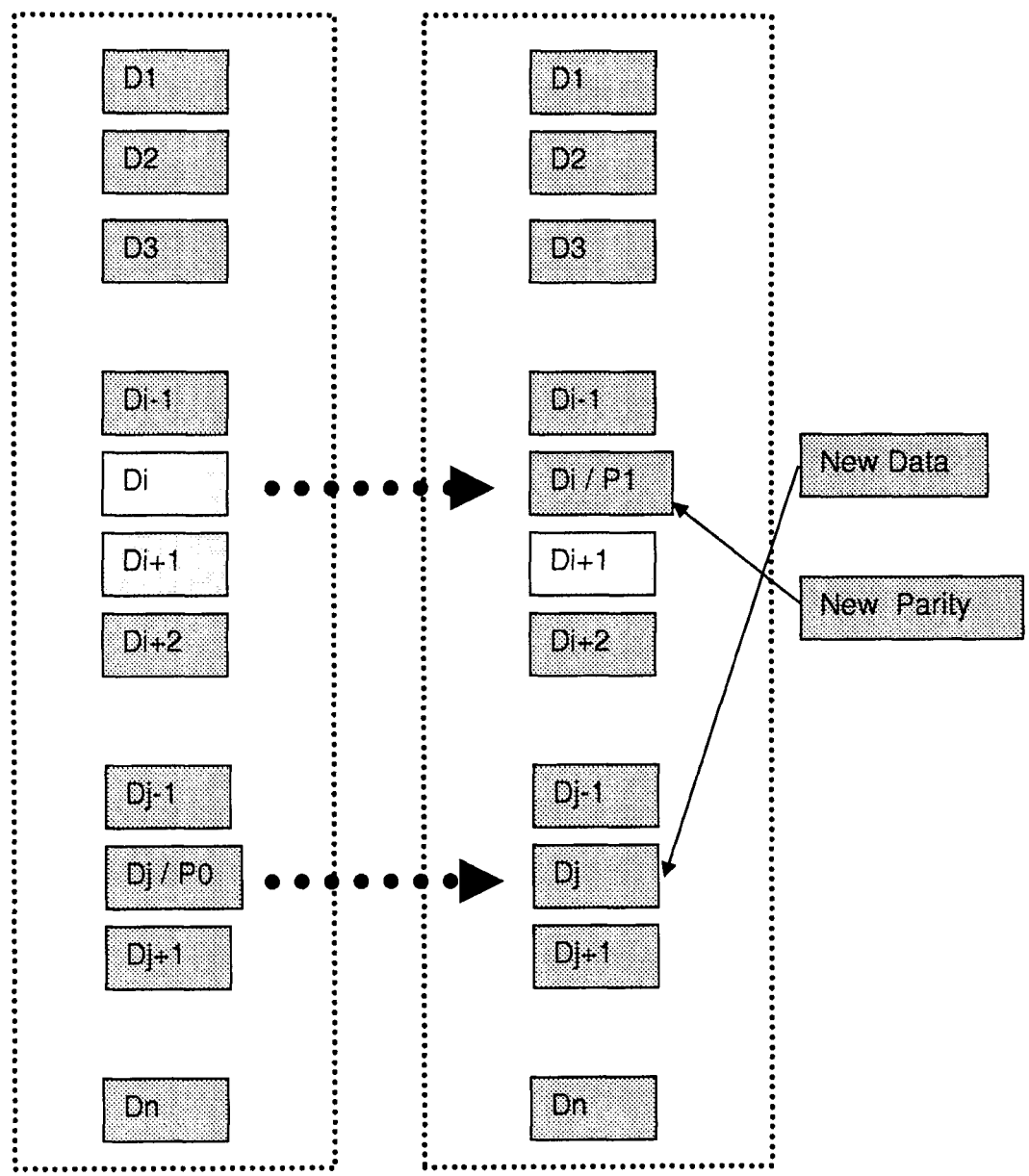

The FIG. 5A to 5C are embodiments of Floating Parity method. In FIG. 5A, the embodiment shows how Floating Parity method select a device block to write parity block and a device block to write a new data block in that row. As showed in FIG. 5A, device blocks D1, D2, D3, . . . , and Dn are blocks in a row. The dark boxes D1, D2, . . . , Di−1 on the left side are blocks on data devices with data already. The dark box Di/P0 on the left side is a block Di that has original parity block P0. The white boxes Di+1, Di+2, . . . , Dn on the left size are empty blocks, blocks with initial value. After write a new data block into this row, this new data block is written to device block Di that is originally for parity block P0. With such write operation, a new parity block is generated. This new parity block P1 is written to next empty device block Di+1 in row. That is, when storage system has empty blocks, storage system always writes new data block to device block that has previous parity block, and new parity block is written to next empty block, picked in sequence from all empty blocks. The new parity block can be generated by well-known method with all data blocks or just simply do P1=P0+Di where '+' is special operation for parity generation.

The FIG. 5B describes an embodiment when previous parity block P0 is in the last device block Dn in a row of device blocks. It means, previous written data block is in device block D(n−1). This situation is showed on the left side of FIG. 5B. In this embodiment, it also showed that data block Di and Di+1 are free blocks, that is these 2 data blocks have had data before but they are freed in the storage system later so these 2 data blocks are free and ready for new data blocks. If Floating Parity method is going to locate next device block, then the next device block is block Di. So, after writing new data to block Dn, new parity block is generated and is written to device block Di. It is showed on the right side of FIG. 5B.

The FIG. 5C describes another embodiment. In general situation, after storage system runs for a certain period of time, the parity block P0 can be in any device block Dj, and this row has free device block Di and Di+1. This general situation is showed on the left side of FIG. 5C. Then, the new data is always writing to last location for original parity block, Dj/P0 on the left ride of FIG. 5C. That is, the previous parity block is in device block Dj with parity block P0. The new data is written to data block Dj showed on right side of FIG. 5C, and new parity block P1 is written to next free device block Di on the right side of FIG. 5C.

In general, above embodiments in FIG. 5A to 5C show that, Floating Parity method picks up device block with previous parity block for writing new data block, newly generated parity block is written to next free device block. So, device block with parity block is a latest written device block. That is, there is no a particular device block in a row or column specifically for parity block. In another way to say, parity block is floating in device blocks in a row or column. Since parity block is updated much more often than any other data block, Floating Parity method can efficiently avoid having too many writing operations to a particular device block.

Figure 6A:
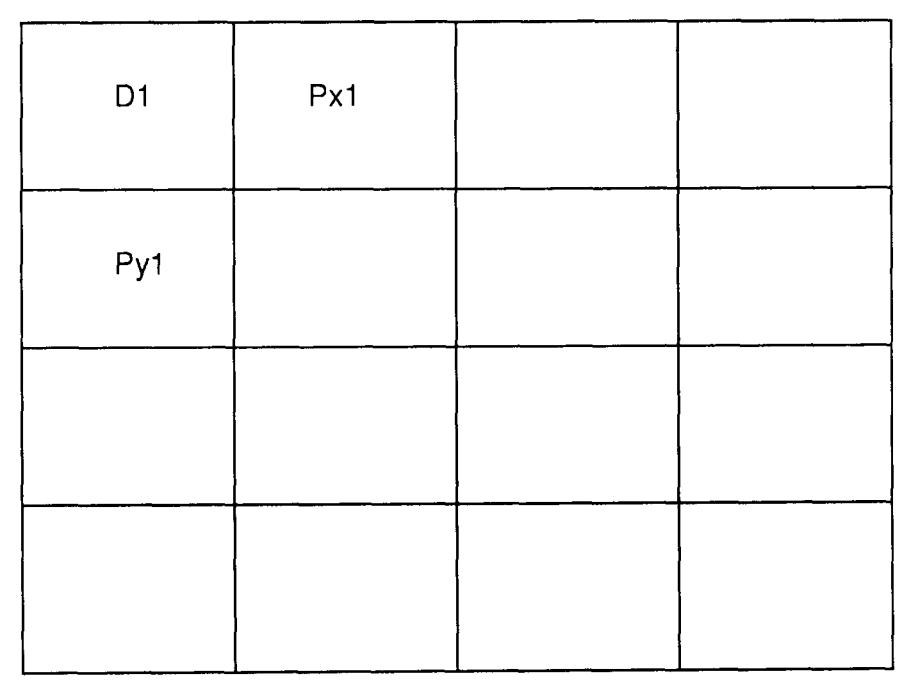
Figure 6B:
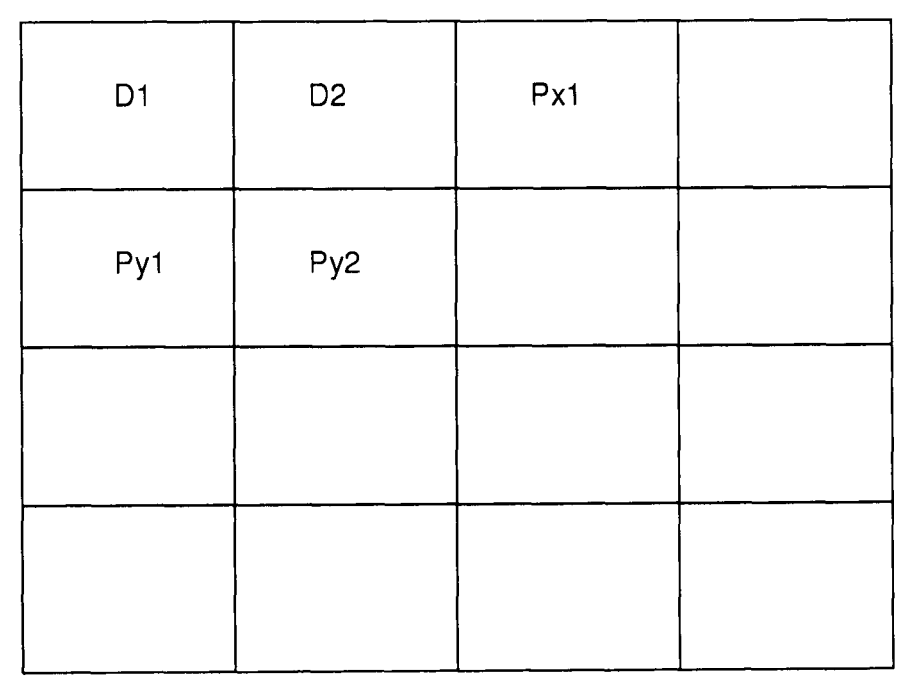
Figure 6C:
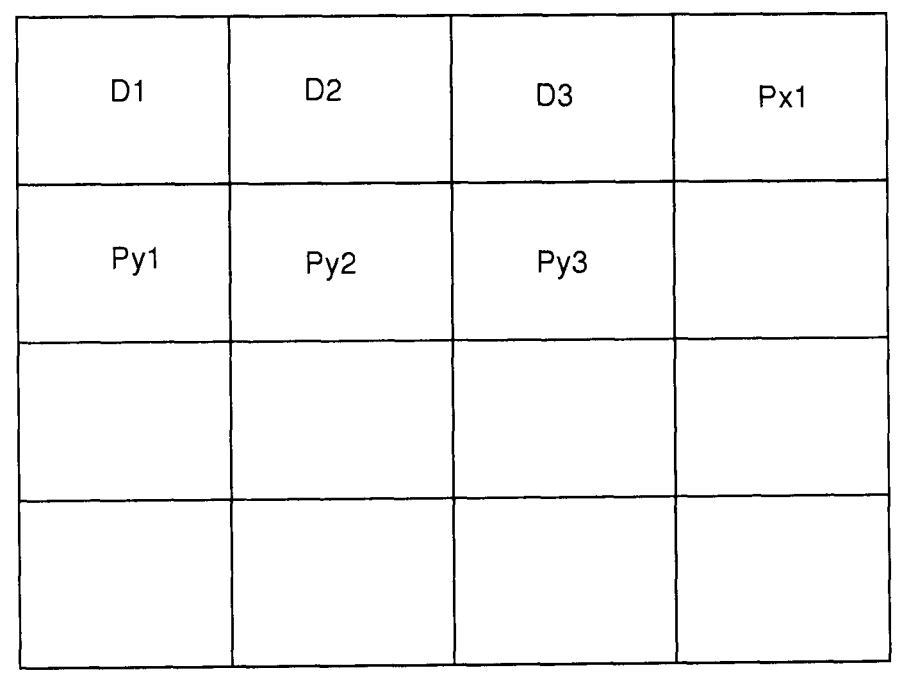
Figure 6D:
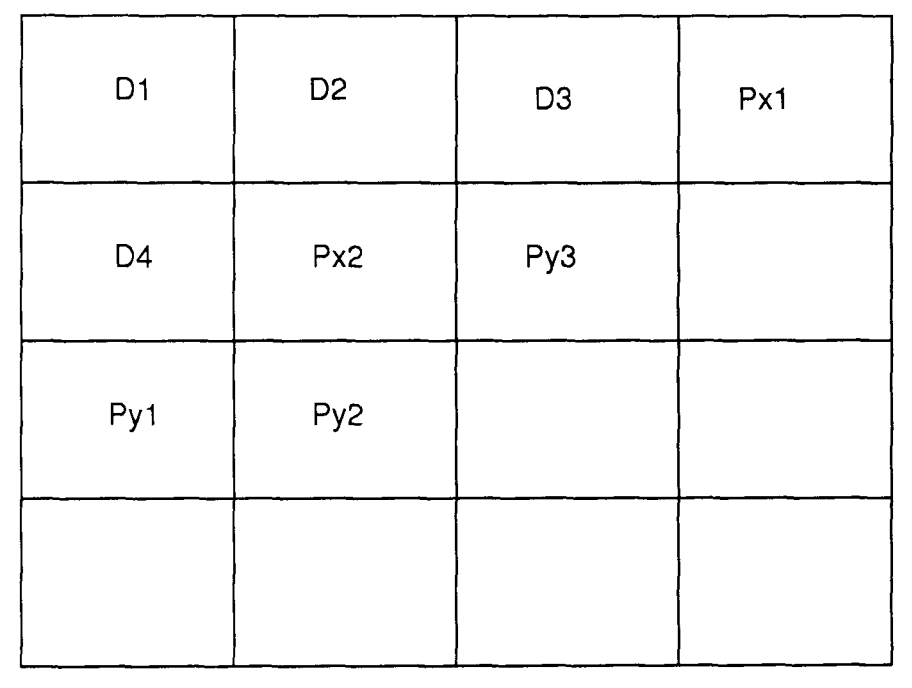
Figure 6E:
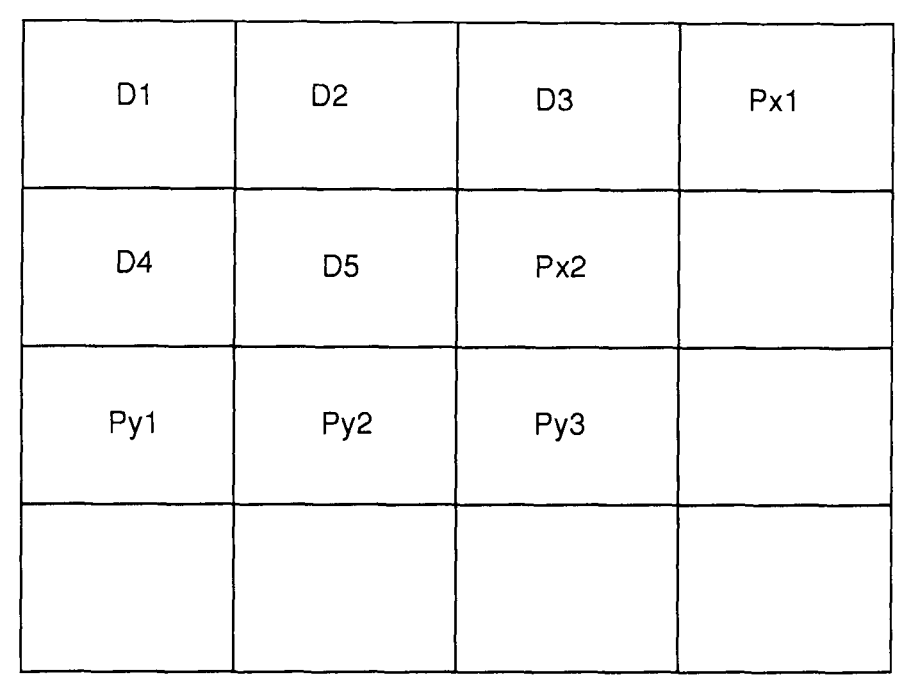
Figure 6F:
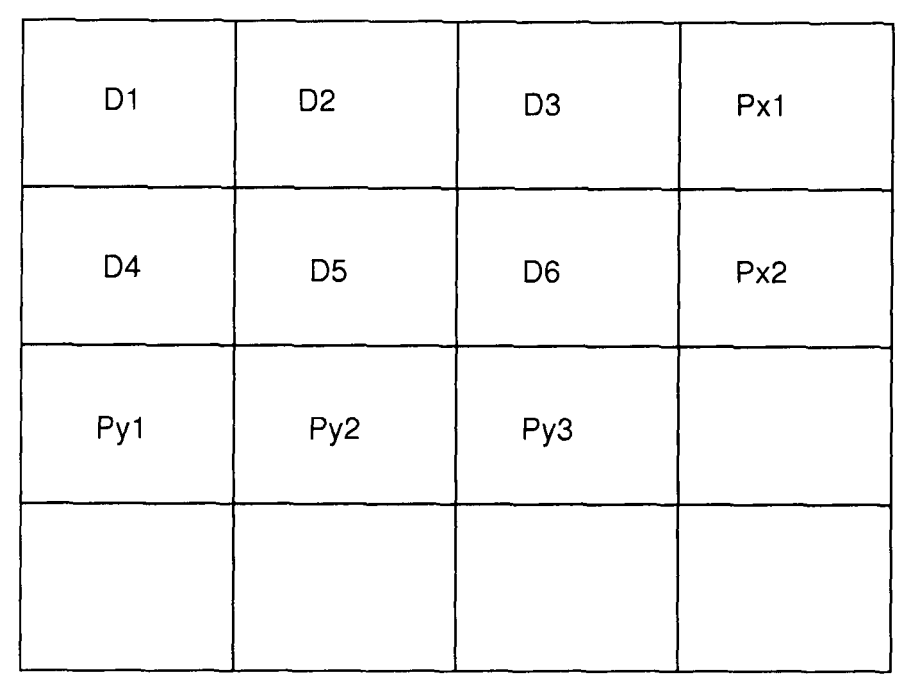

The FIG. 6A to 6G are embodiments that show how device block is picked up by Floating Parity method to write data block into a matrix of devices in 4 rows by 4 columns, until all device blocks in matrix are all written once at least. The D1-D9 are data blocks written to device blocks in sequence. The Px1-Px3 are parity blocks in row of data blocks. The Py1-Py3 are parity blocks in column of data blocks. FIG. 6A is an embodiment that shows data block D1 is written to the matrix. FIG. 6B shows the matrix after D2 is written to the matrix. All of FIG. 6C to FIG. 6G show how 4 rows by 4 columns matrix looks like after each data block is written to the matrix. With Floating Parity method, write operations are properly distributed to different device blocks.

The FIGS. 7A and 7B are embodiments that show how a new data block D10 is written into matrix when next freed device block is device block that previously has data block D4 in FIG. 7A. In such situation, device block with parity block Py1 in FIG. 7A is last written place in that column so new data block D10 in FIG. 7B is written to this device block. Because device block with data block D4 in FIG. 7A is a freed device block and it is picked for next write operation by Floating Parity method, new column parity block Py1 in FIG. 7B is written to this device block. The row parity block Px2 is also updated and written to the same device block.

The FIG. 8A and FIG. 8B are embodiments that show how next new data block D11 is written into the matrix when next freed device block is device block that previously has data block D8 in FIG. 8A. In such situation, device block with parity block Py2 in FIG. 8A is last written place in that column so new data block D11 in FIG. 8B is written to this device block. Because device block with data block D8 in FIG. 8A is a freed device block and it is picked for next write operation, new column parity block Py2 in FIG. 8B is written to this device block. The row parity block Px3 is also updated and written to the same device block.

Figure 9:
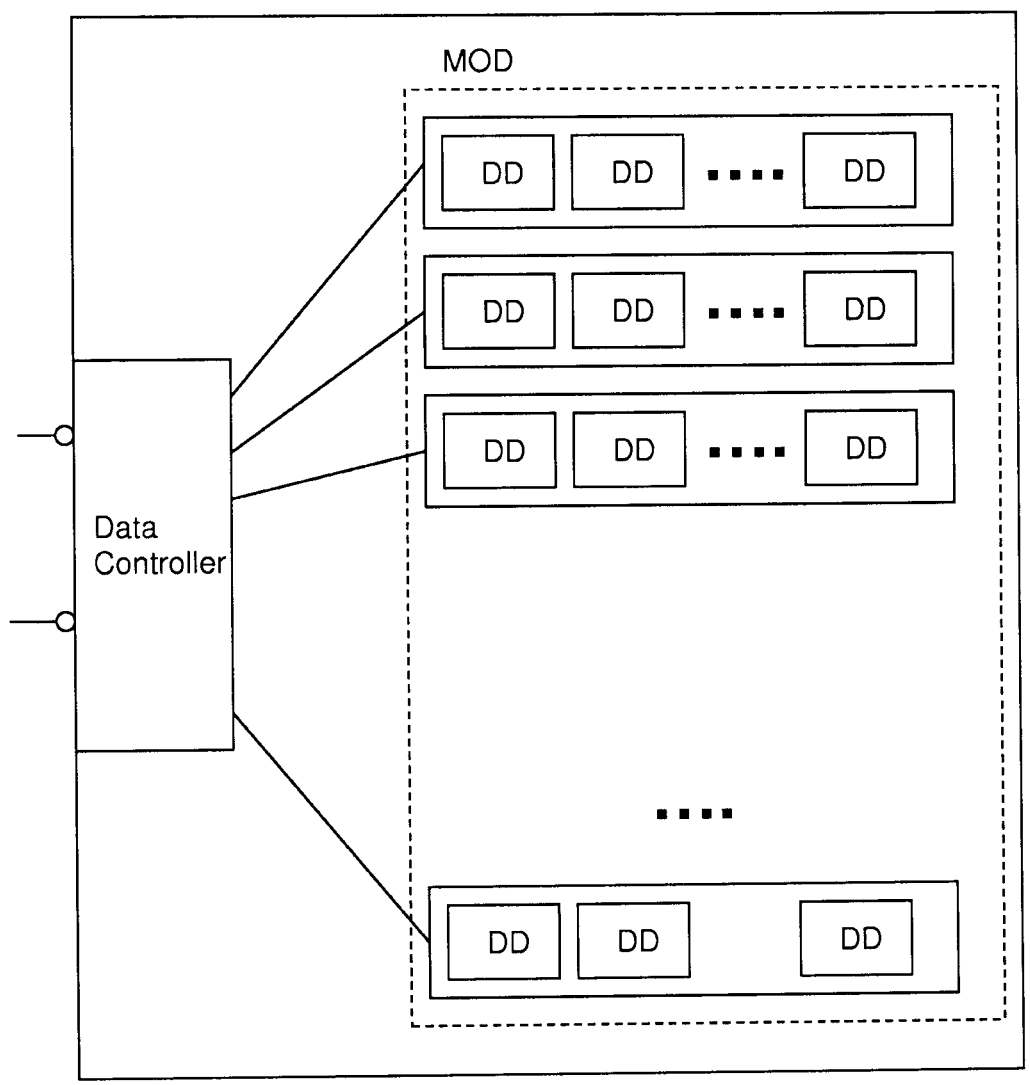
FIG. 9 shows high level architecture of Big Data Device

The FIG. 9 shows an important part of Big Data Device (BDD in FIG. 9), called as Data Controller. The Data Controller has 2 ports for data I/O in front and connections in the back to all shelves of data devices. The Data Controller receives data I/O from one of these 2 ports and delivers data I/O to one of these data devices. These 2 ports are all active ports so both of them can be used for data I/O at the same time. When one port is in error, another port is still available for data I/O. These 2 ports are not Active-Standby ports so there is no port failover mechanism. The higher level controller (File System Controller in FIG. 1) will take care of I/O switchover. That is, when File System Controller in FIG. 1 discovers path error on one path to one port, File System Controller will automatically switch data I/O on that path to another path to another port to make data I/O success. The problematic path to one port will be handled by support engineer for fixing possible hardware failure.

Figure 10:
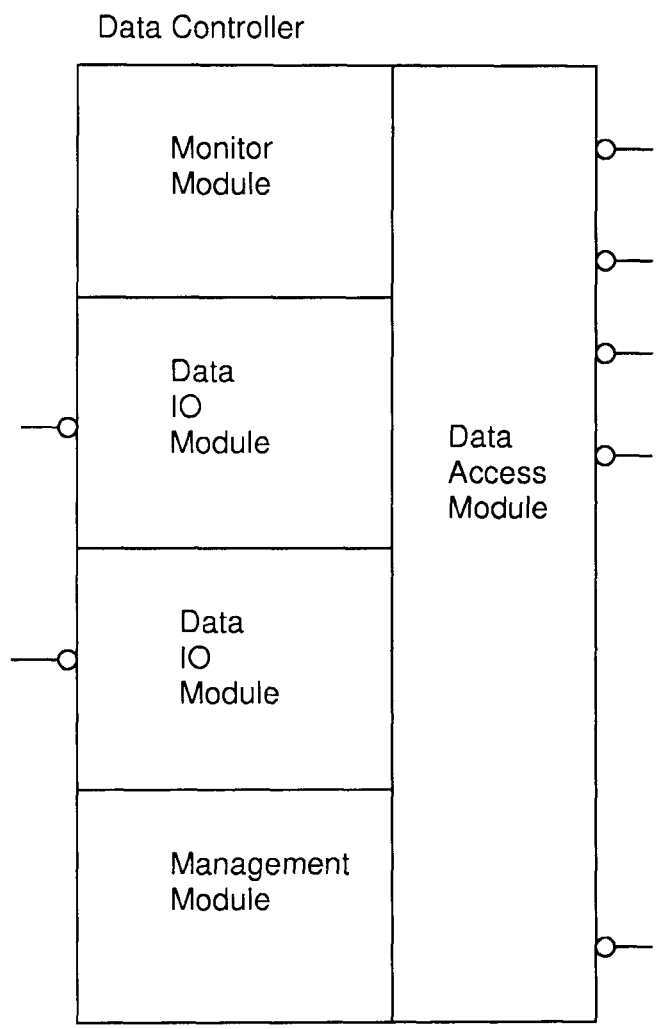
FIG. 10 shows different modules in Data Controller

The FIG. 10 shows more details on Data Controller. It has 5 modules: Monitor Module, Management Module, 2 Data I/O Modules, and Device Access Module. Each module performs its own functions. Monitor Module performs health check on Big Data Device, recover faulty data device, etc. Management Module performs management or configuration tasks for Big Data Device. Each Data I/O Module has one port to receive data I/O, figure out the right device for read or write, and pass operation to Device Access Module. The Device Access Module works with shelf of data devices to perform either read or write operation.

In general, embodiments of the invention relate to a method in storing data in Big Data Device. This Big Data Device provides a much big capacity of data space than a single physical data device. With 2 layer protection, Reliable Big Capacity Storage System provides a much reliable file system to avoid data loss due to possible multiple physical devices failures. The Big Data Device can be used as a single data device to replace a single physical device for a file system, and also can be grouped together to build a reliable file system. This Big Data Device consists of a matrix of devices protected by row parity and column parity with Floating Parity technology. The row parity and column parity provides a capability of recovering multiple failed physical data devices, for more than 2 physical data devices in a row or a column. Another protection in storage system protects data when Big Data Device is failed unexpected. Also, Floating Parity is different from other well known parity technology in practice. Floating Parity utilizes common well known algorithms to generate parity block, and write parity block into next available data block in a row of data devices or a column of data devices. In such way, writing operation is properly distributed to different device blocks, to avoid frequently write operation onto a particular data device that causes high risk of data device failure. The limited number of embodiments of this invention describes this invention but not all parts of this invention. The scope of this invention should be limited by the attached claims.

What is claimed is:

1. A method for providing row-parity-protection, column-parity-protection, and high-level-parity-protection in a big capacity storage system, the big capacity storage system having a plurality of big data devices, each of the plurality of big data devices having data devices arranged logically as rows and columns in an array, the method comprising:

selecting a floating row parity block from the data devices in each row of the array of each of the plurality of big data devices to store row parity data for the data devices in the respective row;

selecting a floating column parity block from the data devices in each column of the array of each of the plurality of big data devices to store column parity data for the data devices in the respective column; and selecting a high-level parity block from the plurality of big data devices to store high-level parity data for the plurality of big data devices;

wherein the row parity data are used to reconstruct data in a failed data device in the respective row;

wherein the column parity data are used to reconstruct data in a failed data device in the respective column; and wherein the high-level parity data are used to reconstruct data in a failed big data device of the plurality of big data devices.

2. The method of claim 1, wherein the data devices arranged logically as rows and columns in the array are mapped to respective physical data devices arranged physically as rows and columns in a physical array and wherein each of the plurality of big data devices further has additional data devices reserved as hot spare devices.

3. The method of claim 2, wherein the physical data devices are selected from the group consisting of hard disk drive, solid state drive, and flash drive.

4. The method of claim 2, wherein the data devices arranged logically as rows and columns in the array are further mapped to respective virtual data devices arranged virtually as rows and columns in a virtual array on internet.

5. The method of claim 2, wherein the hot spare devices are used to replace selected failed data devices in the respective big data device of the plurality of big data devices and wherein a new mapping to the hot spare devices are established and no physically removing of physical data devices are involved.

6. The method of claim 2, wherein the step of selecting the floating row parity block from the data devices in each row of the array of each of the plurality of big data devices comprises:
locating available data device blocks in the respective row, wherein the available data device blocks are unused data device blocks or released data device blocks;
selecting a selected available data device block associated with a lowest block address from the available data device blocks; and
designating the selected available data device block as the selected floating row parity block.

7. The method of claim 2, wherein the floating row parity block is obsolete after a new data block arrives and wherein the floating row parity block is released and becomes available for writing new data.

8. The method of claim 2, further comprising:
after the step of selecting the floating row parity block from the data devices in each row of the array of each of the plurality of big data devices,
locating unused data device blocks in the respective row;
locating released data device blocks in the respective row;
designating an unused data device block associated with a lowest block address from the unused data device blocks as a new data block for writing data; and
if no unused data device blocks being available, designating an released data device block associated with a lowest block address from the released data device blocks as another new data block for writing data.

9. The method of claim 2, wherein an algorithm based on configuration is used to determine if the floating row parity block or the floating column parity block is selected for writing a new data block.

10. The method of claim 2, wherein the big capacity storage system further has a data controller having two active ports to receive and send input and output (I/O) data.

11. The method of claim 10, wherein the two active ports serve as receivers and senders.

12. The method of claim 10, wherein the big capacity storage system further has a file system controller and wherein the file system controller uses the two active ports of the data controller for load balancing.

13. The method of claim 10, wherein the data controller performs tasks selected from the group consisting of health monitor, faulty device recovery, system management and configuration, receiving I/O request, and data I/O operation.

14. The method of claim 10, wherein the data controller further has a monitoring module and wherein the monitoring module performs health monitoring and faulty device recovery.

15. The method of claim 10, wherein the data controller further has a management module and wherein the management module performs system management and configuration.

16. The method of claim 10, wherein the data controller further has a data access module and wherein the data access module performs data I/O operation.

17. The method of claim 10,
wherein the big capacity storage system further has a file system controller;
wherein the data controller further has two data I/O modules; and
wherein each of the data I/O module has one port to perform read or write operation from the file system controller.

18. The method of claim 1, wherein the big capacity storage system further has a file system controller.

19. The method of claim 18, wherein two of the plurality of big data devices are used as a first high-level parity block and a second high-level parity block for extra protection.

* * * * *